(12) United States Patent
Lorenzetti et al.

(10) Patent No.: US 11,046,060 B2
(45) Date of Patent: Jun. 29, 2021

(54) LAMINATED PACKAGING MATERIAL COMPRISING A BARRIER FILM AND PACKAGING CONTAINERS MANUFACTURED THEREFROM

(71) Applicant: Tetra Laval Holdings & Finance S.A., Pully (CH)

(72) Inventors: Cesare Lorenzetti, Bulle (CH); Pierre Fayet, Lausanne (CH); Gil Rochat, Mézières (CH); Claude Bergerioux, Meillerie (FR)

(73) Assignee: TETRA LAVAL HOLDINGS & FINANCE S.A., Pully (CH)

( * ) Notice: Subject to any disclaimer, the term of this patent is extended or adjusted under 35 U.S.C. 154(b) by 304 days.

(21) Appl. No.: 15/772,513

(22) PCT Filed: Oct. 25, 2016

(86) PCT No.: PCT/EP2016/075696
§ 371 (c)(1),
(2) Date: Apr. 30, 2018

(87) PCT Pub. No.: WO2017/072123
PCT Pub. Date: May 4, 2017

(65) Prior Publication Data
US 2019/0077125 A1    Mar. 14, 2019

(30) Foreign Application Priority Data

Oct. 29, 2015  (EP) .................................... 15192206
Oct. 29, 2015  (EP) .................................... 15192208
Oct. 29, 2015  (EP) .................................... 15192211

(51) Int. Cl.
*B32B 1/08*      (2006.01)
*B32B 27/00*   (2006.01)
(Continued)

(52) U.S. Cl.
CPC ................ *B32B 27/08* (2013.01); *B32B 7/12* (2013.01); *B32B 27/10* (2013.01); *B32B 27/306* (2013.01);
(Continued)

(58) Field of Classification Search
CPC .. B32B 7/02; B32B 7/12; B32B 27/08; B32B 2439/62; B32B 27/34; B32B 27/36;
(Continued)

(56) References Cited

U.S. PATENT DOCUMENTS

| | | | |
|---|---|---|---|
| 2008/0145564 A1* | 6/2008 | Allam .................... | C09D 7/63 427/514 |
| 2012/0100320 A1* | 4/2012 | Toft ........................ | B32B 7/02 428/35.6 |
| 2018/0079188 A1 | 3/2018 | Grefenstein et al. | |

FOREIGN PATENT DOCUMENTS

| | | |
|---|---|---|
| CN | 103608178 A | 2/2014 |
| EP | 0764519 A1 | 3/1997 |

(Continued)

OTHER PUBLICATIONS

EPO International Search Report in PCT/EP2016/075696 dated Dec. 19, 2016 in 3 pages.

(Continued)

*Primary Examiner* — Ellen S Hock
(74) *Attorney, Agent, or Firm* — Knobbe, Martens, Olson & Bear, LLP

(57) ABSTRACT

A packaging laminate that includes a barrier film having a PECVD barrier coating of diamond-like carbon is disclosed, along with a method of manufacturing such films, and laminated packaging materials comprising such films, in particular intended for liquid food packaging are disclosed. Packaging containers that include the laminated packaging material or being made from the laminated packaging mate- (Continued)

Figure 1A:
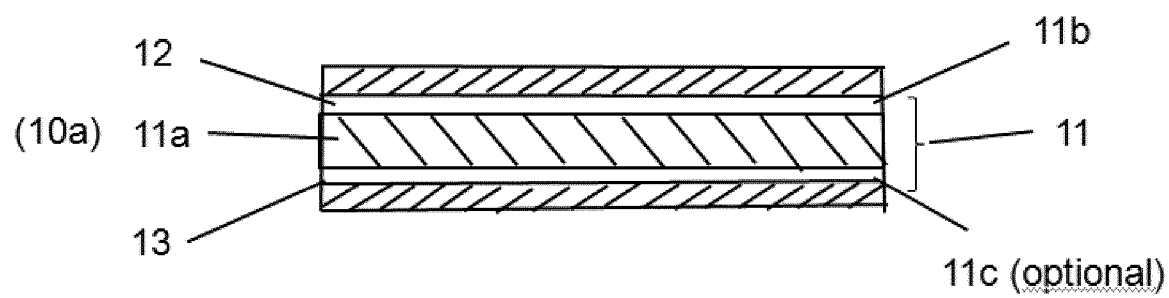

rial, in particular to a packaging container intended for liquid food packaging are also disclosed.

18 Claims, 8 Drawing Sheets

(51) Int. Cl.
| | |
|---|---|
| B32B 27/08 | (2006.01) |
| B32B 7/12 | (2006.01) |
| B32B 27/32 | (2006.01) |
| B32B 27/36 | (2006.01) |
| B65D 85/72 | (2006.01) |
| B65D 8/00 | (2006.01) |
| B65D 75/12 | (2006.01) |
| B65D 75/48 | (2006.01) |
| B65D 5/06 | (2006.01) |
| B65B 1/02 | (2006.01) |
| B65D 5/56 | (2006.01) |
| B32B 27/30 | (2006.01) |
| B65B 7/28 | (2006.01) |
| B65B 51/26 | (2006.01) |
| B65B 9/20 | (2012.01) |
| B65D 5/62 | (2006.01) |
| B32B 27/10 | (2006.01) |
| B32B 27/34 | (2006.01) |
| C23C 16/27 | (2006.01) |
| B65D 5/74 | (2006.01) |

(52) U.S. Cl.
CPC ............ *B32B 27/32* (2013.01); *B32B 27/325* (2013.01); *B32B 27/34* (2013.01); *B32B 27/36* (2013.01); *B65B 1/02* (2013.01); *B65B 7/2878* (2013.01); *B65B 9/2049* (2013.01); *B65B 51/26* (2013.01); *B65D 5/064* (2013.01); *B65D 5/067* (2013.01); *B65D 5/563* (2013.01); *B65D 5/62* (2013.01); *B65D 11/04* (2013.01); *B65D 15/02* (2013.01); *B65D 75/12* (2013.01); *B65D 75/48* (2013.01); *B65D 85/72* (2013.01); *C23C 16/27* (2013.01); *B32B 2255/00* (2013.01); *B32B 2255/10* (2013.01); *B32B 2255/20* (2013.01); *B32B 2307/7244* (2013.01); *B32B 2307/7246* (2013.01); *B32B 2307/7248* (2013.01); *B32B 2439/46* (2013.01); *B32B 2439/60* (2013.01); *B32B 2439/62* (2013.01); *B32B 2439/70* (2013.01); *B65D 5/746* (2013.01); *Y10T 428/1307* (2015.01); *Y10T 428/1352* (2015.01)

(58) Field of Classification Search
CPC .................. B32B 27/10; B32B 27/325; B32B 2307/7244; B32B 2307/7246; B32B 2307/7248; B32B 2439/46; B32B 2439/60; B32B 2439/70; Y10T 428/31725; Y10T 428/1307; Y10T 428/1352; B65D 75/12
USPC .................................... 428/35.6, 537.5, 34.1
See application file for complete search history.

(56) References Cited

FOREIGN PATENT DOCUMENTS

| | | | |
|---|---|---|---|
| JP | 2002 145346 A | 5/2002 |
| JP | 2002 200694 A | 7/2002 |
| JP | 2004 314407 A | 11/2004 |
| JP | 2005 088452 A | 4/2005 |
| JP | 2006 315359 A | 11/2006 |
| JP | 2008 173936 A | 7/2008 |
| JP | 2008 248374 A | 10/2008 |
| RU | 2202473 C2 | 4/2003 |
| RU | 2487065 C2 | 7/2013 |
| WO | WO 2013/041469 A1 | 3/2013 |

OTHER PUBLICATIONS

EPO Extended Search Report in Application No. 15192211.9 dated Jan. 8, 2016 in 7 pages.

\* cited by examiner

LAMINATED PACKAGING MATERIAL COMPRISING A BARRIER FILM AND PACKAGING CONTAINERS MANUFACTURED THEREFROM

TECHNICAL FIELD

The present invention relates to a, laminated packaging material comprising a barrier film having a vapour deposited barrier coating of amorphous diamond-like carbon, in particular intended for liquid food packaging, and to a method for manufacturing the laminated packaging material.

Furthermore, the invention relates to packaging containers comprising the laminated packaging material or being made of the laminated packaging material in its entirety. In particular, the invention relates to packaging containers intended for liquid food packaging, comprising the laminated packaging material.

BACKGROUND OF THE INVENTION

Packaging containers of the single use disposable type for liquid foods are often produced from a packaging laminate based on paperboard or carton. One such commonly occurring packaging container is marketed under the trademark Tetra Brik Aseptic® and is principally employed for aseptic packaging of liquid foods such as milk, fruit juices etc, sold for long term ambient storage. The packaging material in this known packaging container is typically a laminate comprising a bulk or core layer of paper or paperboard and outer, liquid-tight layers of thermoplastics. In order to render the packaging container gas-tight, in particular oxygen gas-tight, for example for the purpose of aseptic packaging and packaging of milk or fruit juice, the laminate in these packaging containers normally comprises at least one additional layer, most commonly an aluminium foil.

On the inside of the laminate, i.e. the side intended to face the filled food contents of a container produced from the laminate, there is an innermost layer, applied onto the aluminium foil, which innermost, inside layer may be composed of one or several part layers, comprising heat sealable thermoplastic polymers, such as adhesive polymers and/or polyolefins. Also on the outside of the bulk layer, there is an outermost heat sealable polymer layer.

The packaging containers are generally produced by means of modern, high-speed packaging machines of the type that form, fill and seal packages from a web or from prefabricated blanks of packaging material. Packaging containers may thus be produced by reforming a web of the laminated packaging material into a tube by both of the longitudinal edges of the web being united to each other in an overlap joint by welding together the inner- and outermost heat sealable thermoplastic polymer layers. The tube is filled with the intended liquid food product and is thereafter divided into individual packages by repeated transversal seals of the tube at a predetermined distance from each other below the level of the contents in the tube. The packages are separated from the tube by incisions along the transversal seals and are given the desired geometric configuration, normally parallelepipedic or cuboid, by fold formation along prepared crease lines in the packaging material.

The main advantage of this continuous tube-forming, filling and sealing packaging method concept is that the web may be sterilised continuously just before tube-forming, thus providing for the possibility of an aseptic packaging method, i.e. a method wherein the liquid content to be filled as well as the packaging material itself are reduced from bacteria and the filled packaging container is produced under clean conditions such that the filled package may be stored for a long time even at ambient temperature, without the risk of growth of micro-organisms in the filled product. Another important advantage of the Tetra Brik®-type packaging method is, as stated above, the possibility of continuous high-speed packaging, which has considerable impact on cost efficiency.

Packaging containers for sensitive liquid food, for example milk or juice, can also be produced from sheet-like blanks or prefabricated blanks of the laminated packaging material of the invention. From a tubular blank of the packaging laminate that is folded flat, packages are produced by first of all building the blank up to form an open tubular container capsule, of which one open end is closed off by means of folding and heat-sealing of integral end panels. The thus closed container capsule is filled with the food product in question, e.g. juice, through its open end, which is thereafter closed off by means of further folding and heat-sealing of corresponding integral end panels. An example of a packaging container produced from sheet-like and tubular blanks is the conventional so-called gable-top package. There are also packages of this type which have a moulded top and/or screw cap made of plastic.

A layer of an aluminium foil in the packaging laminate provides gas barrier properties quite superior to most polymeric gas barrier materials. The conventional aluminium-foil based packaging laminate for liquid food aseptic packaging is still the most cost-efficient packaging material, at its level of performance, available on the market today.

Any other material to compete with the foil-based materials must be cost-efficient regarding raw materials, have comparable food preserving properties and have a comparably low complexity in the converting into a finished packaging laminate.

Among the efforts of developing non-aluminium-foil materials for liquid food carton packaging, there is a general incentive towards developing pre-manufactured films or sheets having multiple barrier functionalities, i.e. not only oxygen and gas barrier but also water vapour, chemical- or aroma-substance barrier properties, which may just replace the aluminium-foil barrier material, of the conventional laminated packaging material, and adapt it to the conventional Al-foil process for lamination and manufacturing.

This is difficult, however, because most alternative barrier films provide insufficient barrier or mechanical strength properties to a laminated packaging material, generate too high total packaging material costs, or fail due to both said aspects. In particular, films having two or more consecutive layers for providing barrier properties, become too expensive to be economically feasible in a packaging laminate.

When it is necessary to complement the main barrier layer, or main barrier coating, of the film, with further layers in order to provide sufficient barrier properties, or to provide improved mechanical properties to the barrier film, costs are added to the packaging material structure as a whole, because such multi-barrier films and packaging materials are much more expensive to manufacture.

DISCLOSURE OF THE INVENTION

It is, accordingly, an object of the present invention to overcome, or at least alleviate, the above-described problems in non-foil laminated packaging materials.

It is also a general object of the invention to provide a laminated packaging material having barrier properties as well as integrity properties that fulfil the needs in liquid carton laminated packaging materials.

It is a further general object of the invention to provide packaging materials for oxygen-sensitive products, such as laminated packaging materials for liquid, semi-solid or wet food products, which do not contain aluminium foil but have good gas and other barrier properties and are suitable for long-term, aseptic packaging at reasonable cost.

A particular object, is to provide a, relative to aluminium foil barrier materials, cost-efficient, non-foil, paper- or paperboard-based, laminated packaging material, having good gas barrier properties, and good integrity properties within the laminated material, for the purpose of manufacturing packages for long-term, aseptic food storage.

Yet a further object of the invention is to provide a cost-efficient, non-foil, paper- or paperboard-based and heat-sealable packaging laminate having good gas barrier properties, and good internal adhesion between the layers, for the purpose of manufacturing aseptic packaging containers for long-term storage of liquid foods at maintained nutritional quality under ambient conditions.

These objects are thus attainable according to the present invention by the the laminated packaging material, the packaging container and the method of manufacturing the packaging material, as defined in the appended claims.

With the term "long-term storage" in connection with the present invention, is meant that the packaging container should be able to preserve the qualities of the packed food product, i.e. nutritional value, hygienic safety and taste, at ambient conditions for at least 1 or 2 months, such as at least 3 months, preferably longer, such as 6 months, such as 12 months, or more.

With the term "package integrity", is generally meant the package durability, i.e. the resistance to leakage or breakage of a packaging container. A main contribution to this property is that within a packaging laminate there is provided good internal adhesion between adjacent layers of the laminated packaging material. Another contribution comes from the material resistance to defects, such as pinholes, ruptures and the like within the material layers, and yet another contribution comes from the strength of the sealing joints, by which the material is sealed together at the formation of a packaging container. Regarding the laminated packaging material itself, the integrity property is thus mainly focused on the adhesion of the respective laminate layers to its adjacent layers, as well as the quality of the individual material layers.

According to a first aspect of the invention, the general objects are attained by a laminated packaging material for packaging of liquid food products, comprising a barrier film, which barrier film comprises a substrate layer in the form of a web or a sheet, and a first coating of an amorphous diamond-like carbon (DLC) coating, the laminated packaging material further comprising a first outermost liquid tight, heat sealable polymer layer on a first side of the barrier film and a second innermost liquid tight, heat sealable polymer layer on the opposite, inner and second side of the barrier film. The first outermost polymer layer provides the outermost surface of a packaging container made from the laminate packaging material, and the second innermost polymer layer provides the innermost surface of a packaging container made from the packaging material to be in contact with the packed product.

The barrier coating of an amorphous DLC is applied by vapour deposition onto the substrate layer and accordingly it is contiguous to the surface of the substrate layer. According to an embodiment, the substrate layer is a polymer film substrate. According to another embodiment, the outermost and innermost liquid tight and heat sealable polymer layers are polyolefin layers.

According to an embodiment of the laminated packaging material, the first outermost liquid tight, heat sealable polymer layer is applied onto the barrier film to be in direct contact, i.e. contiguous to a first surface of the barrier film. According to another embodiment, the second innermost liquid tight, heat sealable polymer layer is applied onto the barrier film to be in direct contact, i.e. contiguous to a second surface of the barrier film.

According to a further embodiment, the laminated packaging material further comprises a bulk layer of paper or paperboard or other cellulose-based material.

In a yet further embodiment, the packaging material further comprises a bulk layer of paper or paperboard or other cellulose-based material, the barrier film being bonded to a first side of the bulk layer by a bonding layer, said first outermost liquid tight, heat sealable polymer layer is applied onto the opposite, second and outer, side of the bulk layer, while said second innermost liquid tight, heat sealable polymer layer is applied on the inner side of the barrier film, i.e. the side of the barrier film which is opposite to the side bonded to the bulk layer.

According to an embodiment of the laminated packaging material, the bonding layer binds together the surface of the first DLC coating of the barrier film and the surface of said first side of the bulk layer. According to a further embodiment, the bonding layer comprises an adhesive polymer or a thermoplastic polymer. According to a special embodiment the bonding layer is a polyolefin, such as in particular a polyethylene-based polyolefin copolymer or blend, including in the majority ethylene monomer units. Preferably, the bonding layer is binding the bulk layer to the barrier film by melt extrusion laminating the bonding polymer layer between a web of the bulk layer and a web of the film layer, and simultaneously pressing the three layers together while being forwarded through a lamination roller nip, thus providing a laminated structure, i.e. by so-called extrusion laminating the bulk layer to the barrer film. According to a special embodiment, the bonding layer is in direct contact with, i.e. contiguous to the first surface of the barrier film, being the first DLC coating.

According to an embodiment, the first DLC coating is a barrier coating.

According to a further embodiment of the laminated packaging material, the substrate layer of the barrier film has an adhesion-promoting primer coating on its other side, opposite the side coated with the barrier coating, and the barrier film is bonded to the second innermost liquid tight, heat sealable polyolefin layer by means of the adhesion-promoting primer coating. The purpose of the adhesion-promoting primer coating is, to create or improve the adhesion strength to an adjacent extrusion-coated polymer, such as a polyolefin-based polymer layer and the contacting surface thereof.

In an embodiment of the laminated packaging material, the adhesion-promoting primer coating is a composition comprising a compound selected from the group consisting of aminosilanes and polyethyleneimines.

In a further embodiment of the laminated packaging material, the adhesion-promoting primer coating is a second coating of an amorphous diamond-like coating (DLC). According to this embodiment, the laminated material thus may be constructed without any conventional adhesives or primers, that need to either cure, or dry at inclusion into the laminated structure.

In a yet further embodiment, the first DLC coating is also an adhesion-promoting coating. In this case, the barrier film is constructed from the substrate layer being a polymer film, which polymer film has inherent barrier properties in the polymer material, such as in polyamide, polyethylene vinyl-alcohol (EVOH) polyester, PET or cyclo-olefin copolymers. The barrier film is coated with a first and second DLC adhesion-promoting coating on each side for the main purpose of providing good adhesion to adjacent thermoplastic polymers, such as polyolefins, such as preferably ethylene-based homo-, or co-polymers or blends. Low barrier properties may be provided by the DLC-coatings also at low thicknesses, such that a combined barrier and adhesion effect is readily achieved from each of the DLC coatings. If further barrier properties are not needed, it is however also conceivable to merely employ the respective DLC coatings for their excellent adhesive properties in extrusion lamination to melt-extruded polymer layers.

In another embodiment, the barrier film of the laminated packaging material is a double barrier film, which comprises a first barrier film being laminated and bonded to a further identical or similar second barrier film by means of an interjacent thermoplastic bonding layer, such as a polyethylene layer, such as low density polyethylene (LDPE). The barrier coatings may be facing towards each other with the interjacent thermoplastic bonding layer in between. Alternatively, the barrier coatings may be facing away from each other, such that the adhesion-promoting primer coatings are bonded to each other by the the interjacent thermoplastic bonding layer. A further alternative is to stack the two films to each other such that both barrier coatings are facing in the same direction. The double barrier film may be further laminated to a bulk layer.

In a further embodiment, a first barrier film is laminated and bonded to a further identical or similar second barrier film by means of an interjacent thermoplastic bonding layer, the laminated packaging material further comprising a first outermost liquid tight, heat sealable polymer layer on the opposite, not laminated side of the first barrier film and a second innermost liquid tight, heat sealable polymer layer on the opposite, not laminated side of the second barrier film. A further laminated packaging material of the invention may be composed of at least two, and up to several barrier films laminate to each other by interjacent thermoplastic bonding layers in between. According to an embodiment of the laminated packaging material, the substrate layer is a polymer film selected from the group consisting of films based on any of polyethylene terephthalate (PET), mono- or biaxially oriented PET (OPET, BOPET), non- or mono- or biaxially oriented polyethylenefuranoate (PEF), oriented or non-oriented polybutylene terephthalate (PBT), polyethylene napthanate (PEN), non-oriented polyamide, oriented polyamide (PA, OPA, BOPA), polyethylene vinyl alcohol (EVOH), polyolefins such as polypropylene, mono- or biaxially oriented polypropylene (PP, OPP, BOPP), polyethylenes such as oriented or non-oriented high density polyethylene (HDPE), linear low density polyethylene (LLDPE) and cyclo-olefin co-polymers (COC), and blends of any of said polymers, or a multilayer film having a surface layer comprising any of said polymers or blends thereof.

According to a more specific embodiment of the laminated packaging material, the polymer film substrate is a film selected from the group consisting of films based on polyesters or polyamides and blends of any of said polymers, or a multilayer film having a surface layer comprising any of said polymers or blends thereof.

According to another more specific embodiment of the laminated packaging material, the polymer film substrate is a film selected from the group consisting of films based on any of polyethylene terephthalate (PET), mono- or biaxially oriented PET (OPET, BOPET), non- or mono- or biaxially oriented polyethylenefuranoate (PEF), polybutylene terephthalate (PBT), polyethylene napthanate (PEN), non-oriented polyamide, oriented polyamide (PA, OPA, BOPA), and blends of any of said polymers, or a multilayer film having a surface layer comprising any of said polymers or blends thereof.

Suitable polyamides are aliphatic polyamides such as polyamide-6 or polyamide-6,6, or semi-aromatic polyamides, such as nylon-MXD6 or Selar polyamide grades, and blends of aliphatic and semi-aromatic polyamides.

According to another embodiment of the laminated packaging material, the first and/or second amorphous diamond-like carbon coating is applied at a thickness from 2 to 50 nm, such as from 5 to 40 nm, such as from 5 to 35 nm, such as from 10 to 350 nm, such as from 20 to 30 nm.

According to another embodiment, the first and/or second amorphous diamond-like carbon coating, acting as an adhesion-promoting primer coating, is applied at a thickness from 2 to 50 nm, such as from 2 to 10 nm, such as from 2 to 5 nm.

According to one specific embodiment, both the first and second amorphous diamond-like carbon coatings are applied at a thickness from 2 to 10 nm, such as from 2 to 8 nm, such as from 2 to 5 nm. It has surprisingly been seen that the final effect on oxygen transmission into finally filled, formed and sealed packages, is almost as good when two such thin DLC coatings interact, as when one thicker DLC-coating interacts with another thinner coating, in a laminated packaging material made in the same way with a same configuration.

According to a specific embodiment of the laminated packaging material, the polymer film substrate is an oriented PET film.

According to a further specific embodiment of the laminated packaging material, the polymer film substrate has a thickness of 12 μm or lower, such as from 8 to 12 μm, such as from 10 to 12 μm.

Thinner polymer film substrates do exist commercially and would be feasible within the scope of the present invention, but it is presently not realistic to go below 8 μm, and films thinner than 4 μm would be difficult from a web-handling point of view in industrial coating and lamination processes for packaging. On the other hand, films thicker than 12-15 μm are of course feasible but less interesting for laminated packaging materials of the invention, since they add too much strength and toughness for the functionality of opening devices and perforations. According to an embodiment, the polymer film substrate should be 12 μm or below, such as an oriented PET film of from 10 to 12 μm, such as about 12 μm. At higher thickness of the film substrate, the tearing and cutting properties of the laminated packaging material are impaired because of the higher strength of the material.

The packaging material comprising the barrier film having a barrier coating of vapour deposited amorphous diamond-like carbon, shows good properties in many respects, such as having low oxygen transmission rate (OTR), low water vapour transmission rate (WVTR), good aroma and odour barrier properties and has good mechanical properties in subsequent handling operations such as lamination into a laminated packaging material and the fold-forming and sealing operations of such a laminated material into packages.

In particular, it has been seen that the laminated packaging material according to the invention has excellent integrity, by providing excellent adhesion between the adjacent layers within the laminated construction and by providing good quality of the barrier coating under severe conditions such as at high relative humidity in the laminated material layers. Especially, for the packaging of liquids, and wet food, it is important that the inter-layer adhesion within the laminated packaging material is maintained also under wet packaging conditions. Among various types of vapour deposition barrier coatings, it has been confirmed that this DLC type of vapour deposited barrier coatings, applied by means of a plasma coating technology, such as by plasma enhanced chemical vapour deposition, PECVD, has excellent laminate integrity properties. Other vapour deposition methods will not produce as good barrier coatings, and will either need two consecutive coating steps or will not produce a coating with sufficiently good density and barrier, or both. Atmospheric plasma coating methods are, for example, known to produce low density, low barrier coatings. Barrier coatings from other types of vapour deposition chemistry, such as SiOx or AlOx coatings, do not, on the other hand, show good integrity properties in a laminated material of the same kind under wet and humid conditions. This extraordinary adhesion compatibility of DLC coatings to organic polymers, such as in particular polyolefins, also under wet conditions was truly surprising, and makes such barrier films particularly suitable for liquid carton laminate packaging.

According to a second aspect of the invention, a packaging container is provided, comprising the laminated packaging material of the invention and intended for packaging of liquid, semi-solid or wet food. According to an embodiment, the packaging container is manufactured from the laminated packaging material of the invention. According to a further embodiment, the packaging container is in its entirety made of the laminated packaging material.

According to a still further embodiment, the packaging container may be formed from the laminated packaging material partly sealed, filled with liquid or semi-liquid food and subsequently sealed, by sealing of the packaging material to itself, optionally in combination with a plastic opening or top part of the package.

Over time, various vapour deposition barrier coatings have been considered in designing laminated packaging materials that fulfil the gas barrier criteria as well as the needs of various mechanical and other physical properties.

Vapour deposited barrier layers may be applied by means of physical vapour deposition (PVD) or chemical vapour deposition (CVD) onto a substrate surface of a film material. The substrate material itself may contribute with some properties as well, but should above all have appropriate surface properties, suitable for receiving a vapour deposition coating, and working efficiently in a vapour deposition process.

Thin vapour deposited layers are normally merely nanometer-thick, i.e. have a thickness in the order of magnitude of nanometers, for example of from 1 to 500 nm (50 to 5000 Å), preferably from 1 to 200 nm, more preferably from 1 to 100 nm and most preferably from 1 to 50 nm.

One common type of vapour deposition coating, often having some barrier properties, in particular water vapour barrier properties, is so called metallisation layers, e.g. aluminium metal physical vapour deposition (PVD) coatings.

Such a vapour deposited layer, substantially consisting of aluminium metal may have a thickness of from 5 to 50 nm, which corresponds to less than 1% of the aluminium metal material present in an aluminium foil of conventional thickness for packaging, i.e. 6.3 µm. While vapour deposition metal coatings require significantly less metal material, they only provide a low level of oxygen barrier properties, at most, and need to be combined with a further gas barrier material in order to provide a final laminated material with sufficient barrier properties. On the other hand, it may complement a further gas barrier layer, which does not have water vapour barrier properties, but which is rather sensitive to moisture.

Other examples of vapour deposition coatings are aluminium oxide (AlOx) and silicon oxide (SiOx) coatings. Generally, such PVD-coatings are more brittle and less suitable for incorporation into packaging materials by lamination. Metallised layers as an exception do have suitable mechanical properties for lamination material despite being made by PVD, however generally providing a lower barrier to oxygen gas.

Other coatings which have been studied for laminated packaging materials may be applied by means of a plasma enhanced chemical vapour deposition method (PECVD), wherein a vapour of a compound is deposited onto the substrate under more or less oxidising circumstances. Silicon oxide coatings (SiOx) may, for example, also be applied by a PECVD process, and may then obtain very good barrier properties under certain coating conditions and gas recipes. Unfortunately, SiOx coatings show bad adhesion properties when laminated by melt extrusion lamination to polyolefins and other adjacent polymer layers, and the laminated material is exposed to wet or highly humid packaging conditions. Special, expensive adhesives or adhesive polymers are needed to reach and maintain sufficient adhesion in a packaging laminate of the type intended for liquid carton packaging.

According to this invention, the vapour deposition coating is an amorphous hydrogenated carbon barrier layer applied by a plasma enhanced chemical vapour deposition process, PECVD, a so-called diamond-like carbon (DLC). DLC defines a class of amorphous carbon material that displays some of the typical properties of diamond. Preferably, a hydrocarbon gas, such as e.g. acetylene or methane, is used as process gas in the plasma for producing the coating. As pointed out above, it has now been seen that such DLC coatings, provide good and sufficient adhesion to adjacent polymer or adhesive layers in a laminated packaging material under wet testing conditions. Particularly good adhesion compatibility with adjacent laminated polymer layers, i.e. polymer layers which are adherent to or coated onto the DLC barrier coating, has been seen with polyolefins and in particular polyethylene and polyethylene-based co-polymers.

The DLC barrier coating thus provides good barrier and integrity properties to liquid-filled packaging containers made from a packaging laminate comprising a barrier film having the barrier coating, by contributing with good mechanical properties, good barrier properties to various substances migrating through such laminated materials in either inward or outward direction from a filled package, as well as by resulting in excellent adhesion to adjacent polymer layers in a laminate. Accordingly, a barrier film from a substrate layer of a polyester or polyamide, having a DLC barrier coating can provide a packaging laminate and a packaging container with oxygen barrier properties as well as water vapour barrier properties, for long term ambient storage, such as for up to 2-6 months, such as for up to 12 months. In addition, the DLC barrier coating provides good barrier properties to various aroma and flavour substances present in the packed food product, to low-molecular substances possibly appearing in the adjacent layers of materials, and to odours and other gases than oxygen. Moreover, the DLC barrier coating, exhibits good mechanical properties, as coated on a polymer film substrate, when laminated into a carton-based packaging laminate, withstanding lamination and subsequent fold-forming of the packaging laminate and sealing it into filled packages. Polyester and polyamide films provide excellent substrate surfaces for the initiation and the growth of a DLC coating layer, during the vapour deposition coating process. Favourable conditions in the coating process result in improved coating quality, and thus the coating layer may be made thinner and still achieve the desired barrier properties as well as adhesion and cohesion properties.

The crack-onset strain (COS) for a biaxially oriented PET film, coated with a DLC barrier coating, may be higher than 2%, and this can normally relate to the oxygen barrier properties of the coating not starting to deteriorate until straining the film above 2%.

The DLC barrier coating may be deposited onto a substrate by means of a plasma-assisted coating technology, such as by a magnetron electrode plasma, capacitively coupled to the power, similar to the type described in U.S. Pat. No. 7,806,981 or by a radio-frequency plasma enhanced chemical vapour deposition, inductively coupled and using a carbonaceous precursor similar to the type described in European patent EP0575299B1.

According to an embodiment, the polymer film substrate is a BOPET film of a thickness of 12 μm or lower, such as from 8 to 12 μm. Oriented films usually exhibit an increased strength and toughness against tearing or cutting through the film, and when included in laminated packaging materials such films can cause difficulties in opening of a package. By selecting as thin as possible polymer film substrates, the openability of a subsequently laminated packaging material will not be impaired, in comparison to laminated packaging materials in which the barrier materials are more brittle and the polymer materials are entirely made by melt extrusion coating and melt extrusion lamination. PET films are robust and cost efficient films with good mechanical properties, and this makes them particularly suitable substrates for DLC vapour deposition coating, due to some inherent high temperature resistance and relative resistance to chemicals and moisture. The surface of a PET film also has high smoothness and good affinity to vapour deposited DLC coatings and vice versa.

According to a further embodiment, the polymer film substrate is a BOPET film that has an adhesion primer coating applied to the other side of the BOPET film, in order to provide better bonding to adjacent layers on both sides of the barrier film, when laminating the film into a laminated packaging material.

According to yet another embodiment, the polymer film substrate is a BOPET film that has an additional DLC coating applied to the other side of the BOPET film layer, in order to provide better bonding to adjacent layers on both sides of the barrier film, when laminating the film into a laminated packaging material.

DLC coatings further have the advantage of being easy recyclable, without leaving residues in the recycled content that contain elements or materials that are not naturally existing in nature and our surrounding environment.

Suitable thermoplastic polymers for the outermost and innermost heat sealable liquid-tight layers in the laminated packaging material of the invention, are polyolefins such as polyethylene and polypropylene homo- or co-polymers, preferably polyethylenes and more preferably polyethylenes selected from the group consisting of low density polyethylene (LDPE), linear LDPE (LLDPE), single-site catalyst metallocene polyethylenes (m-LLDPE) and blends or copolymers thereof. According to a preferred embodiment, the outermost heat sealable and liquid-tight layer is an LDPE, while the innermost heat sealable, liquid-tight layer is a blend composition of m-LLDPE and LDPE for optimal lamination and heat sealing properties.

The same thermoplastic polyolefin-based materials, in particular polyethylenes, as listed regarding the outermost and innermost layers, are also suitable in bonding layers interior of the laminated material, i.e. between a bulk or core layer, such as paper or paperboard, and the barrier film.

According to an alternative embodiment, suitable for the bonding layers interior of the laminated material, i.e. between an outer heat sealable layer and the barrier- or primer-coated substrate layer, or for bonding the barrier film to the bulk layer in a mono- or multilayer such bonding laminate layer, are also so-called adhesive thermoplastic polymers, such as modified polyolefins, which are mostly based on LDPE or LLDPE co-polymers or, graft co-polymers with functional-group containing monomer units, such as carboxylic or glycidyl functional groups, e.g. (meth) acrylic acid monomers or maleic anhydride (MAH) monomers, (i.e. ethylene acrylic acid copolymer (EAA) or ethylene methacrylic acid copolymer (EMAA)), ethylene-glycidyl(meth)acrylate copolymer (EG(M)A) or MAH-grafted polyethylene (MAH-g-PE). Another example of such modified polymers or adhesive polymers are so called ionomers or ionomer polymers. Preferably, the modified polyolefin is an ethylene acrylic acid copolymer (EAA) or an ethylene methacrylic acid copolymer (EMAA).

Corresponding modified polypropylene-based thermoplastic adhesives or bonding layers may also be useful, depending on the requirements of the finished packaging containers.

Such adhesive polymer layers or tie layers are normally applied together with the respective outer layer or further bulk-to-barrier bonding layers in a co-extrusion coating operation.

However, normally, the use of the above described adhesive polymers should not be necessary for bonding to the DLC barrier coating of the invention. Sufficient and adequate adhesion to polyolefin layers as adjacent layers have been concluded, at a level of at least 200 N/m, such as at least 300 N/m. Adhesion measurements are performed at room temperature with a 180° degrees peel force test apparatus (Telemetric Instrument AB), 24 h after the LDPE lamination. Peeling is performed at the DLC/LDPE interface, the peel-arm being the barrier film. When needed, distilled water droplets are added to the peeled interface during peeling to assess the adhesion under wet conditions, i.e. the conditions when the laminated packaging material has been saturated with migrating moisture through the material layers, from the liquid stored in a packaging container made from the laminated material, and/or by storage in a wet or highly humid environment. The given adhesion value is given in N/m and is an average of 6 measurements.

A dry adhesion of more than 200 N/m ensures that the layers do not delaminate under normal package manufacturing conditions, e.g. when bending and fold-forming the laminated material. A wet adhesion of this same level ensures that the layers of the packaging laminate do not delaminate after filling and package formation, during transport, distribution and storage. The interior bonding polymer layer may be coated directly onto the polymer film substrate having a DLC barrier layer coated thereon, by using common techniques and machines, e.g. those known for the lamination of an aluminum foil, in particular hot lamination (extrusion) of the polymer layer from a molten polymer onto the DLC barrier coating. Also, using a pre-made polymer film and binding it directly to the barrier-coated carrier film by locally melting it, e.g. by applying heat with a hot cylinder or heated roller, is possible. From the above it is apparent that the DLC barrier film can be handled in a similar way to an aluminium foil barrier in the lamination and conversion methods into a laminated packaging material, i.e. by means of extrusion lamination and extrusion coating. The lamination equipment and methods do not require any modification, by for example adding specific adhesive polymers or binder/tie layers as may be required in previously known plasma coated materials. In addition, the new barrier film including the DLC barrier layer coated thereon can be made as thin as an aluminium foil without adversely affecting the barrier properties in the final food package.

It has been seen that when laminating the DLC barrier coating surface to an adjacent layer of e.g. polyethylene, such as LDPE, the contributing oxygen barrier properties from the barrier film are increased to a 2-3 times higher value. This barrier improvement by merely laminating the DLC barrier coating of the invention into a laminate, cannot be explained by a simple laminate theory, according to which $$1/OTR = SUM_i(1/OTR_i)$$

but it does, thus, improve the total barrier beyond the individual contribution of OTR by each laminate layer. It is believed that it is the excellent adhesion between the DLC coating and the polyolefin surface that leads to a particularly well integrated interface between the two materials, and thereby to improved oxygen barrier properties.

In a preferred embodiment of the invention, the peel force strength between the DLC barrier coating layer and the further, laminating, bonding polymer layer as measured by the 180° peel test method under dry and wet conditions (by putting water at the peeling interface) (as described above) is higher than 200 N/m, such as higher than 300 N/m. A dry adhesion of more than 200 N/m ensures that the layers do not delaminate under normal manufacturing conditions, e.g. when bending and fold-forming the laminated material. A wet adhesion of the same level ensures that the layers of the packaging laminate do not delaminate after filling and package formation, during transport, distribution and storage.

EXAMPLES AND DESCRIPTION OF PREFERRED EMBODIMENTS

Figure 1B:
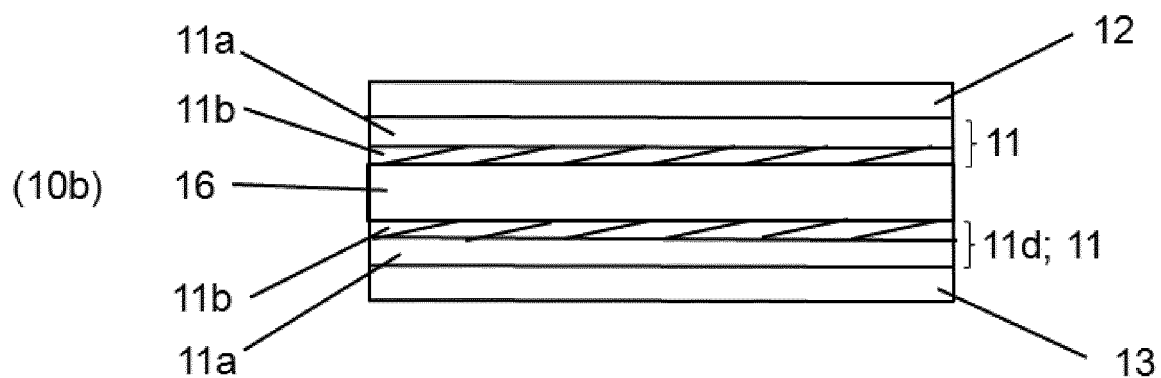
Figure 2:
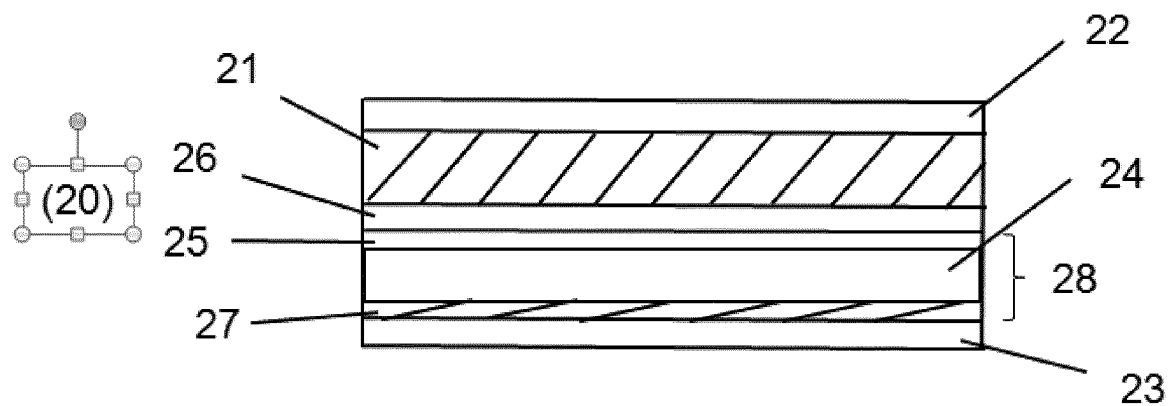
Figure 3:
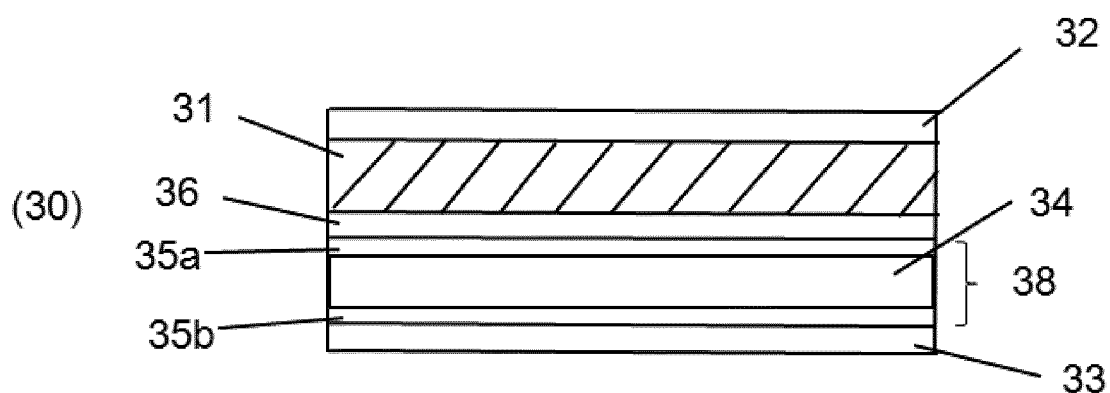
Figure 4:
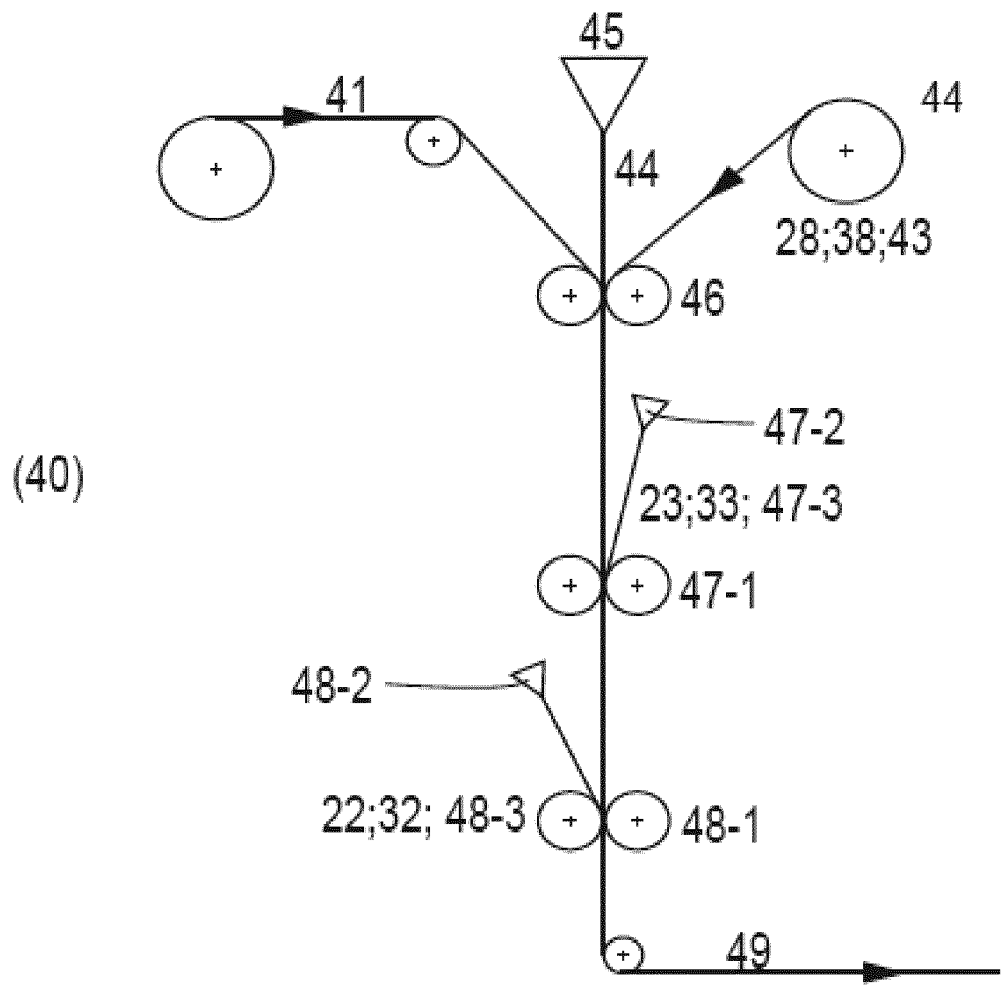
Figure 5A:
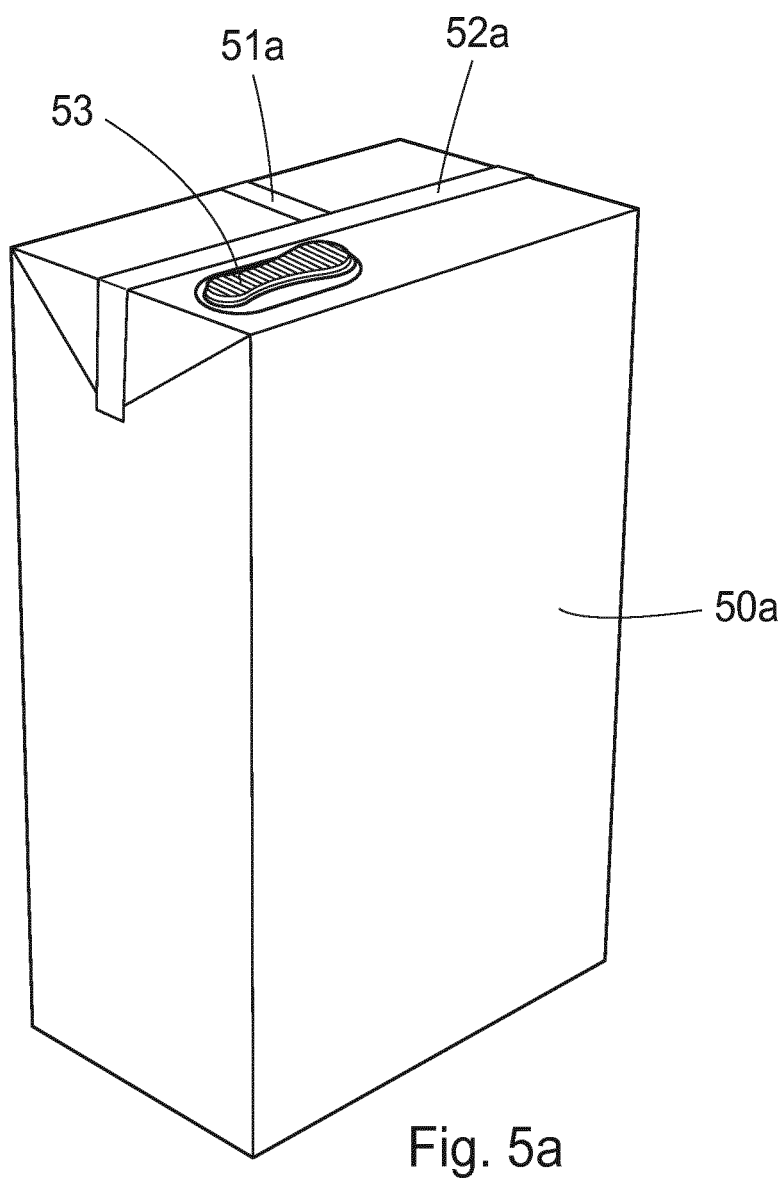
Figure 5B:
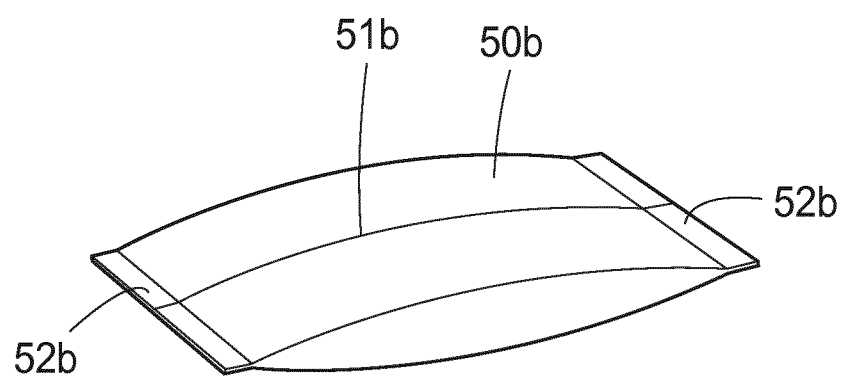
Figure 5C:
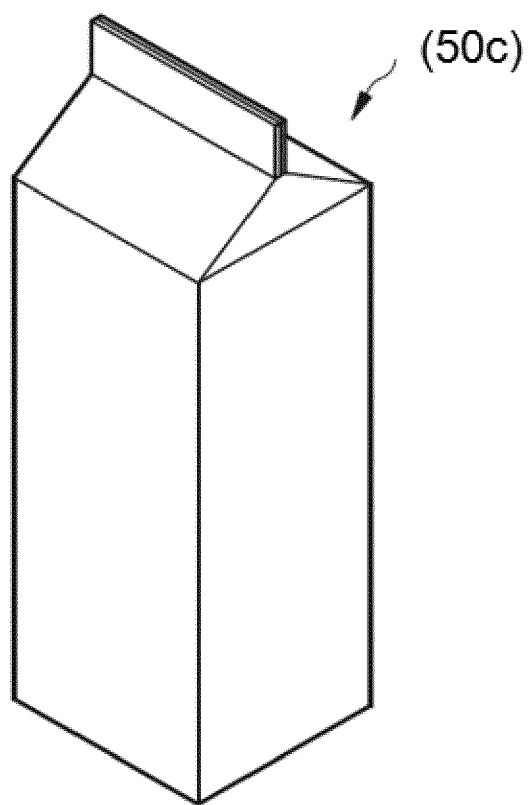
Figure 5D:
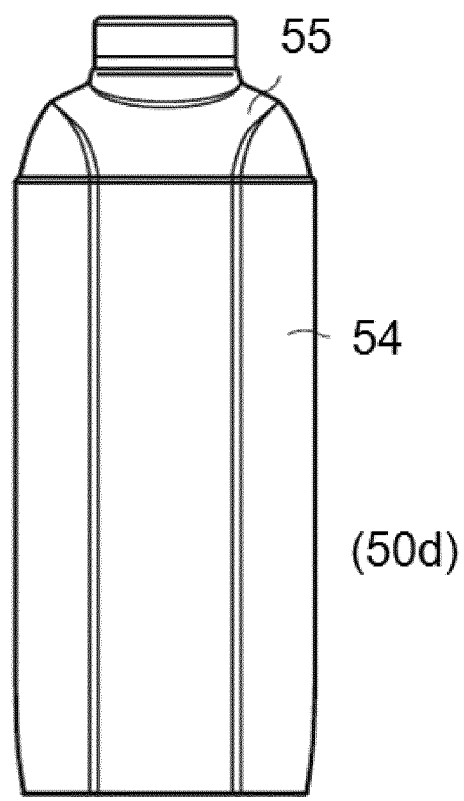
Figure 6:
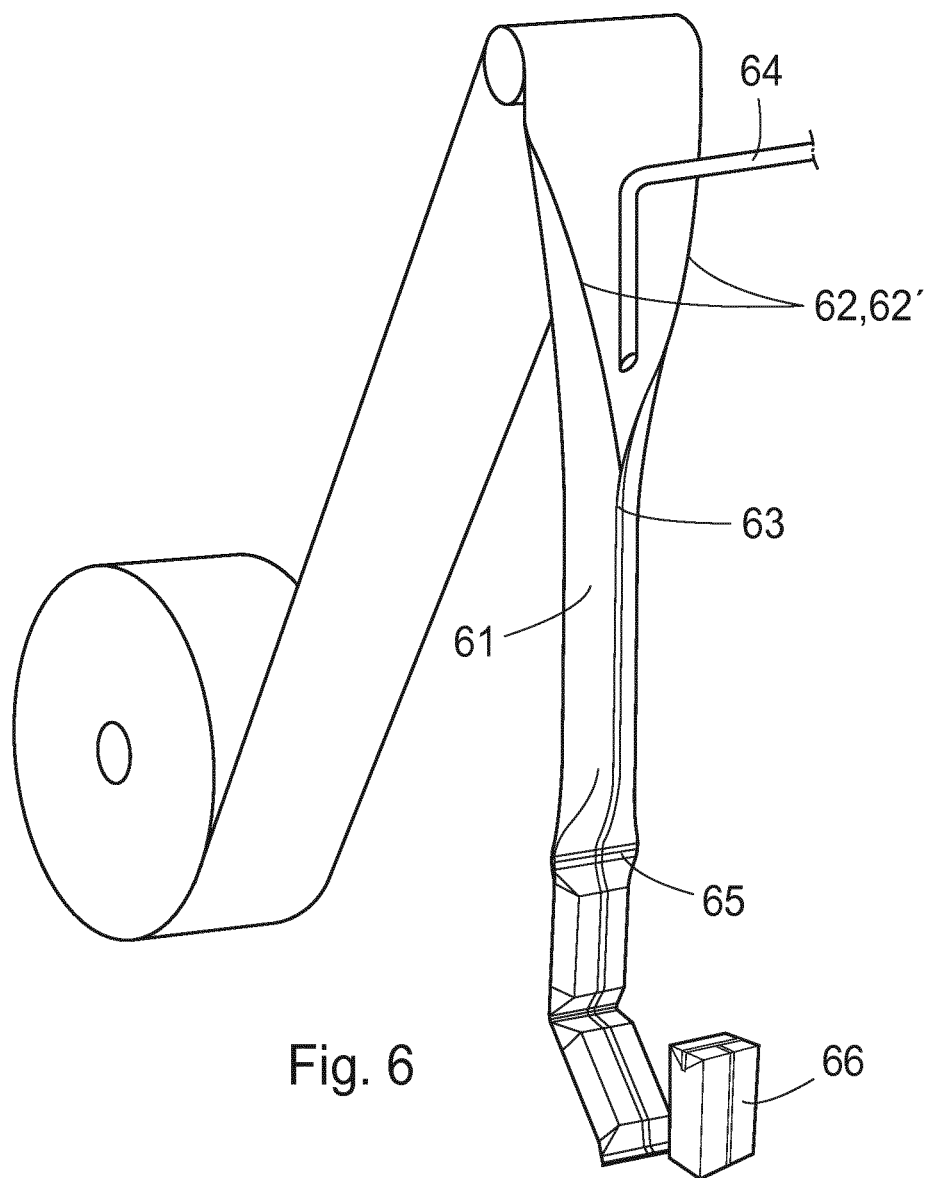

In the following, preferred embodiments of the invention will be described with reference to the drawings, of which:

FIG. 1a is showing a schematic, cross-sectional view of a laminated packaging material of a multilayer film type, according to an embodiment of the invention, FIG. 1b shows a schematic, cross-sectional view of a further embodiment of a laminated packaging material of the multilayer film type, FIG. 2 is showing a schematic, cross-sectional view of a laminated packaging material comprising a bulk layer, according to another embodiment of the invention, FIG. 3 is showing a schematic, cross-sectional view of a further laminated packaging material comprising a bulk layer, according to a further embodiment of the invention, FIG. 4 shows schematically a method, for laminating the barrier film of the invention into a laminated packaging material of the type of FIGS. 2 and 3, for liquid food packaging, having a core or bulk layer of paperboard or carton, FIGS. 5a, 5b, 5c and 5d are showing typical examples of packaging containers produced from the laminated packaging material according to the invention, and FIG. 6 is showing the principle of how such packaging containers are manufactured from the packaging laminate in a continuous, roll-fed, form, fill and seal process.

EXAMPLES

Example 1

Films from 12 µm thick biaxially oriented polyethyleneterephthalate (BOPET Hostaphan RNK12 and RNK12-2DEF by Mitsubishi) were deposition coated with various coatings by plasma enhanced chemical vapour deposition (PECVD) under vacuum conditions, in a roll-to-roll plasma reactor. A diamond-like amorphous hydrogenated carbon coating, DLC, was coated on some film samples, in line with the invention, while other PECVD barrier coatings were coated on other samples. The other PECVD barrier coatings, subject of comparative examples, were SiOx, wherein x varied between 1.5 and 2.2, SiOxCy coatings and SiOxCyNz coatings, respectively, wherein (y+z)/x is from 1 to 1.5. These other silicon-containing barrier coatings were formed from organosilane pre-cursor gas compounds. The film samples according to the invention, were coated by depositing an amorphous, hydrogenated diamond-like coating DLC from a plasma formed from pure acetylene gas.

The plasma employed was capacitively coupled to the power delivered at 40 kHz frequency, and magnetically confined by unbalanced magnetron electrodes placed at a distance from the circumferential surface of a rotating drum, which functioned as a combined film-web transporting means and electrode. The polymer film substrate was cooled by cooling means within the drum web-transporting means.

The DLC coating was in a first example applied to a thickness of about 15-30 nm, and in a second example to a thickness of only about 2-4 nm.

The SiOx coatings were coated to a thickness of about 10 nm.

The thus barrier-coated substrate film samples, were subsequently extrusion coated with a 15 g/m2 thick layer of low density polyethylene (LDPE), of a type corresponding to LDPE materials of the laminate bonding layer that is conventionally used in order to extrusion laminate paperboard to aluminium foil in liquid carton packaging laminates.

The adhesion between the thus extrusion coated LDPE layer and the barrier-coated substrate PET film, was measured by a 180° peel test method under dry and wet conditions (by putting distilled water at the peeling interface) as described above. An adhesion of more than 200 N/m ensures that the layers do not delaminate under normal manufacturing conditions, e.g. when bending and fold-forming the laminated material. A wet adhesion of this same level ensures that the layers of the packaging laminate do not delaminate after filling and package formation, during transport, distribution and storage.

TABLE 1

| Coating type | Oxygen Barrier | Water Vapour Barrier | PE-laminate Peel force (N/m) Dry adhesion | PE-laminate Peel force (N/m) wet adhesion |
|---|---|---|---|---|
| SiOx (x = 1.5-2.2) | <3 cc at 3⁶ Mean 1.5 cc | N/A | 40-50 | 0 |
| SiOxCy (y/x = 1-1.5) | <3 cc at 3⁶ Mean 1.5 cc | 1 | 40-50 | 40-50 |
| SiOxCyNz (y + z/x = 1-1.5) | <3 cc at 3⁶ Mean 1.5 cc | 1 | 200-300 | 100 |
| DLC ~25 nm | <3 cc at 3⁶ Mean 1.5 cc | 0.8 | 350-400 | 350-400 |
| DLC ~25 nm on both sides of film | 0.5 ± 0.05 | 0.5 | 350-400 | 350-400 |
| DLC 2-4 nm | 60-80 | 5-6 | 350-400 | 350-400 |
| DLC 2-4 nm on both sides of film | 60-80 | 5-6 | 350-400 | 350-400 |

OTR was measured with Oxtran 2-60 (Mocon Inc.) equipment based on coulometric sensors, with a standard deviation of the results being ±0.5 cm$^3$/m$^2$/day.

The method for determining OTR identifies the amount of oxygen per surface and time unit at passing through a material at a defined temperature, given atmospheric pressure, and chosen driving force.

Water vapour transmission rate (WVTR) measurements were carried out by a Lyssy instrument (norm: ASTM F1249-01 using a modulated Infrared sensor for relative humidity detection and WVTR measurement) at 38° C. and 90% driving force. This test method is dedicated to measure Water Vapor Transmission Rate (WVTR) properties of films. The procedure is done according to ASTM F1249-01 using a modulated Infrared sensor for relative humidity detection and WVTR measurement.

As can be seen from the results summarised in Table 1, there is some insufficient dry adhesion between pure SiOx barrier coatings and thereonto extrusion coated LDPE, while the adhesion deteriorates completely under wet/humid conditions.

When experimenting with more advanced SiOx formulas, containing also carbon and nitrogen atoms, some improvement is seen in the dry and/or wet adhesion properties, as compared to the pure SiOx coating, but the wet adhesion properties remain insufficient, i.e. below 200 N/m.

The dry adhesion of a DLC coating to extrusion coated LDPE is slightly better than for the best of the tested SiOxCyNz coatings. The more important and unforeseeable difference, compared to the SiOxCyNz coatings is that the adhesion remains constant under wet or humid conditions, such as are the conditions for laminated beverage carton packaging.

Furthermore, and rather surprisingly, the excellent adhesion of DLC coatings at values above 200 N/m, remain unaffected also when the DLC coating is made thinner, and as thin as 2 nm, i.e. where there is actually no notable barrier properties obtained any longer. This is the case both regarding dry and wet conditions for the sample films.

Of course, when such films are laminated into packaging laminates of paperboard and thermoplastic polymer materials, it is advantageous to coat such a DLC coating on both sides of the film, in order to provide excellent adhesion on both sides of the film. Alternatively, the adhesion to adjacent layers on the opposite side of the substrate film, may be secured by a separately applied chemical primer composition, such as the 2 DEF® primer from Mitsubishi. A DLC adhesion-promoting layer is preferable from both environmental and cost perspective, since it only involves carbon atoms in the adhesion layer, and since it may be made very thin in order to just provide adhesion, or thicker in order to provide also barrier properties. At any thickness of a DLC-coating, the adhesion obtained is at least as good as that of a chemical primer (such as the 2 DEF® from Mitsubishi) under both dry and wet conditions.

Example 2

A similar BOPET film to the one used in Example 1 was coated with similar thin DLC coatings on one and two sides, as described in Table 2. OTR was measured as cc/m$^2$/day/atm at 23° C. and 50% RH, by the same method as in Example 1. The DLC-coated films were subsequently laminated into packaging material structures including a paperboard with an outer LDPE layer, by means of a bonding layer of 15 g/m$^2$ of LDPE, and by being further coated on the opposite side of the film with an inside layer of a blend of LDPE and mLLDPE at 25 g/m$^2$. The OTR was measured on the laminated packaging material by the same method as described previously.

Subsequently, the laminated packaging materials were reformed into 1000 ml standard Tetra Brik® Aseptic packaging containers, on which the total oxygen transmission was further measured, by a Mocon 1000 equipment at 23° C. and 50% RH.

| Test ID | Film structure | Thickness DLC 1 coating (nm) | Thickness DLC 2 coating (nm) | OTR Film (mean) | OTR packaging material (mean) | OTR Package (mean) |
|---|---|---|---|---|---|---|
| A | /BOPET/DLC2/ | — | 3.4 | 21.8 | — | — |
| A | /DLC1/BOPET/DLC2/ | 11.9 | 3.4 | 1.1 | 1.6 | 0.037 |
| B | /BOPET/DLC2/ | — | 3.4 | 19.3 | — | — |
| B | /DLC1/BOPET/DLC2/ | 3.5 | 3.4 | 10.5 | 1.8 | 0.027 |

Very surprisingly, it was found that when measured on laminated packaging material, and on packages from the packaging material, the oxygen barrier properties were on the same level or even improved by the film of Test B, although the film in Test B was coated with only two very thin DLC coatings, while in Test A, one of the coatings was thicker and actually intended for providing the resulting oxygen barrier properties of the film. By the measurements on the barrier-coated films, the film of Test A was indeed better, but when laminated into a final laminated packaging material structure, and used in a packaging container, both the two films were performing very well, and the film of Test B was even performing better than the film of Test A.

Thus, by the DLC-coated barrier films described above, high-integrity packaging laminates are provided, which have maintained excellent adhesion between layers also when used in liquid packaging, i.e. at subjecting the packaging material to wet conditions, and which may consequently protect other layers of the laminate from deterioration, in order to provide as good laminated material properties as possible. Since the DLC coatings provide both goodoxygen barrier properties and water vapour barrier properties, it is a highly valuable type of barrier coating to be used in carton package laminates for liquid food products.

Further, relating to the attached figures:

In FIG. 1a, there is shown, in cross-section, a first embodiment of a laminated packaging material, 10, of the invention. It comprises a barrier film 11 having a substrate layer 11a of a polymer film having a surface of PET or PA, in this case an oriented PET (BOPET) film having a thickness of 12 µm, wherein the substrate layer is coated with an, amorphous DLC coating 11b, by means of a plasma enhanced chemical vapour deposition, PECVD, coating, in order to improve the oxygen barrier (decrease the OTR value) of the barrier film. The vapour deposited coating 11b is a hydrogenated carbon coating (C:H) which is evenly deposited to a substantially transparent coating. The thickness of the DLC coating is 20 to 40 µm. On its other side, opposite to the DLC barrier coating, the film substrate is coated with a thin layer of an adhesion-promoting primer 11c, such as 2-DEF, a priming composition from Mitsubishi Chemicals. The barrier film is laminated to a layer of a thermoplastic and heat sealable polymer layer on each side, 12,13, which may or may not be identical. The thermoplastic and heat sealable polymer layers are preferably polyolefin based polymers, and form the outermost, heat sealable layers of the laminate.

According to an alternative embodiment, the barrier film 11 as schematically shown in FIG. 1a, has instead, on its other side, opposite to the DLC barrier coating, been coated with a different thin layer of an adhesion-promoting, and/or barrier coating, layer 11c, of a further DLC PECVD coating.

In FIG. 1b, a similar barrier film 11 is provided, by a polymer film substrate 11a as in FIG. 1a, i.e. a BOPET film substrate, being vapour deposition coated on the coating side with a similar, amorphous DLC coating 11b, by means of plasma enhanced chemical vapour deposition coating, PECVD, in order to improve the oxygen barrier (decrease the OTR value). On its other side, opposite to the durable DLC barrier coating, the film substrate may be coated with a thin layer of an adhesion-promoting primer 11c of a DLC PECVD coating. The barrier film 11 is laminated to a further identical or similar barrier film 11; 11d, by means of an interjacent bonding layer 16 of a thermoplastic polymer, such as a polyolefin or modified polyolefin layer, such as a layer of LLDPE or a multilayer configuration of several individually identical or different polyethylene layers. The intermediate bonding layer is thus bonding to the DLC coating surfaces of both barrier films 11; 11d. On each side the barrier film is laminated to a layer of a thermoplastic and heat sealable polymer layer 12,13. Thus, the outermost layers of thermoplastic and heat sealable polymer are each contacting the adhesion-promoting primer coatings 11c (optional), of a DLC primer coating of each of the barrier films 11; 11d. A possible alternative adhesion-promoting coating 11c could be a chemical primer coating of the type 2 DEF® from Mitsubishi.

In a further embodiment not shown, the outermost layer of a thermoplastic and heat sealable polymer layer 12; 22; 32, which is to constitute the outside of a packaging container made of the laminated material, is applied onto a bulk layer 21;31, which is laminated and positioned between the double barrier film obtained above and the outermost layer 12, the double barrier film being the double structure in which the intermediate bonding layer is bonding together the DLC barrier coating surfaces 11b of two barrier films 11; 11d. The double barrier film may contain further DLC coatings 11c for barrier and/or for adhesion-promotion purposes.

In FIG. 2, a laminated packaging material 20 of the invention, for liquid carton packaging, is shown, in which the laminated material comprises a paperboard bulk layer 21, having a bending force of 320 mN, and further comprises an outer liquid tight and heat sealable layer 22 of polyolefin applied on the outside of the bulk layer 21, which side is to be directed towards the outside of a packaging container produced from the packaging laminate. The polyolefin of the outer layer 22 is a conventional low density polyethylene (LDPE) of a heat sealable quality, but may include further similar polymers, including LLDPEs. An innermost liquid tight and heat sealable layer 23 is arranged on the opposite side of the bulk layer 21, which is to be directed towards the inside of a packaging container produced from the packaging laminate, i.e. the layer 23 will be in direct contact with the packaged product. The thus innermost heat sealable layer 23, which is to form the strongest seals of a liquid packaging container made from the laminated packaging material, comprises one or more in combination of polyethylenes selected from the groups consisting of LDPE, linear low density polyethylene (LLDPE), and LLDPE produced by polymerising an ethylene monomer with a C4-C8, more preferably a C6-C8, alpha-olefin alkylene monomer in the presence of a metallocene catalyst, i.e. a so called metallocene-LLDPE (m-LLDPE).

The bulk layer 21 is laminated to a barrier film 28, comprising a substrate layer 24 of a polymer film, in this case an oriented PET film having a thickness of 12 µm, which is coated on a first side with a layer of a thin PECVD vapour deposited layer of amorphous, DLC barrier material, 25, at a thickness of from from 2-50 nm, such as from 5 to 40 nm. On its second, opposite, side, the polymer film substrate is coated with an adhesion-promoting primer 27, in this case 2-DEF, a priming composition from Mitsubishi Chemicals. The first, DLC-coated, side of the thus barrier-coated film 24 is laminated to the bulk layer 21 by an intermediate layer 26 of bonding thermoplastic polymer or by a functionalised polyolefin-based adhesive polymer, in this example by a low density polyethylene (LDPE). The intermediate bonding layer 26 is formed by means of extrusion laminating the bulk layer and the durable barrier film to each other. The thickness of the intermediate bonding layer 26 is preferably from 7 to 20 µm, more preferably from 12-18 µm. Excellent adhesion will be obtained between these layers, providing good integrity of the laminated material, in that the PECVD-coated DLC barrier coating is containing substantial amounts of carbon material, which exhibits good adhesion compatibility with organic polymers, such as polyolefins, such as in particular polyethylene and polyethylene-based co-polymers. The innermost heat sealable layer 23 consists of two or several part-layers of the same or different kinds of LDPE or LLDPE or blends thereof and has likewise good adhesion and integrity with the adjacent primer-coated side of the barrier film.

In FIG. 3, a laminated packaging material 30 of the invention, for liquid carton packaging, is shown, in which the laminated material comprises a paperboard bulk layer 31, having a bending force of 320 mN, and further comprises an outer liquid tight and heat sealable layer 32 of polyolefin applied on the outside of the bulk layer 31, which side is to be directed towards the outside of a packaging container produced from the packaging laminate. The polyolefin of the outer layer 32 is a conventional low density polyethylene (LDPE) of a heat sealable quality, but may include further similar polymers, including LLDPEs. An innermost liquid tight and heat sealable layer 33 is arranged on the opposite side of the bulk layer 31, which is to be directed towards the inside of a packaging container produced from the packaging laminate, i.e. the layer 33 will be in direct contact with the packaged product. The thus innermost heat sealable layer 33, which is to form the strongest seals of a liquid packaging container made from the laminated packaging material, comprises one or more in combination of polyethylenes selected from the groups consisting of LDPE, linear low density polyethylene (LLDPE), and LLDPE produced by polymerising an ethylene monomer with a C4-C8, more preferably a C6-C8, alpha-olefin alkylene monomer in the presence of a metallocene catalyst, i.e. a so called metallocene-LLDPE (m-LLDPE).

The bulk layer 31 is laminated to a barrier film 38, comprising a substrate layer 34 of a polymer film, in this case an oriented PET film having a thickness of 12 μm, which is coated on a first side with a layer of a thin PECVD vapour deposited layer of amorphous, DLC barrier material, 35a, at a thickness of from from 2-50 nm, such as from 5 to 40 nm, such as from 10 to 40 nm. On its second, opposite, side, the polymer film substrate is coated with a second amorphous DLC coating 35b. The second amorphous DLC coating may add barrier properties too, but can also act merely as an adhesion promoting primer coating, and may then have a thickness as low as 2-4 nm. The first, DLC-coated, side of the thus barrier-coated film 34 is laminated to the bulk layer 31 by an intermediate layer 36 of bonding thermoplastic polymer or by a functionalised polyolefin-based adhesive polymer, in this example by a low density polyethylene (LDPE). The intermediate bonding layer 36 is formed by means of extrusion laminating the bulk layer and the durable barrier film to each other. The thickness of the intermediate bonding layer 36 is preferably from 7 to 20 μm, more preferably from 12-18 μm. The innermost heat sealable layer 33 may consist of two or several part-layers of the same or different kinds of LDPE or LLDPE or blends thereof. Excellent adhesion will be obtained between these layers on the inside of the bulk layer 31, providing good integrity of the laminated material, in that the PECVD-coated DLC barrier coating is containing substantial amounts of carbon material, which exhibits good adhesion compatibility with organic polymers, such as polyolefins, such as in particular polyethylene and polyethylene-based co-polymers.

In FIG. 4, the lamination process 40 is shown, for the manufacturing of the packaging laminate 20; 30, of FIG. 2, and FIG. 3, respectively, wherein the bulk layer 41 is laminated to the barrier film 28; 38; 43 by extruding an intermediate bonding layer of LDPE 44 from an extrusion station 45 and pressing together in a roller nip 46. The barrier film 28; 38; 43 has an amorphous DLC barrier coating, deposited on the surface of the polymer film substrate, whereby the DLC coating is to be directed towards the bulk layer when laminated at the lamination station 46. Subsequently, the laminated paper bulk and barrier film passes a second extruder feedblock 47-2 and a lamination nip 47-1, where an innermost heat sealable layer 23; 33; 47-3 is coated onto the barrier-film side of the paper-film laminate forwarded from 46. Finally, the laminate, including an innermost heat sealable layer 47-3, passes a third extruder feedblock 48-2 and a lamination nip 48-1, where an outermost heat sealable layer of LDPE 22; 32; 48-3 is coated onto the outer side of the paper layer. This latter step may also be performed as a first extrusion coating operation before lamination at 46, according to an alternative embodiment. The finished packaging laminate 49 is finally wound onto a storage reel, not shown.

FIG. 5a shows an embodiment of a packaging container 50a produced from the packaging laminate 20 according to the invention. The packaging container is particularly suitable for beverages, sauces, soups or the like. Typically, such a package has a volume of about 100 to 1000 ml. It may be of any configuration, but is preferably brick-shaped, having longitudinal and transversal seals 51a and 52a, respectively, and optionally an opening device 53. In another embodiment, not shown, the packaging container may be shaped as a wedge. In order to obtain such a "wedge-shape", only the bottom part of the package is fold formed such that the transversal heat seal of the bottom is hidden under the triangular corner flaps, which are folded and sealed against the bottom of the package. The top section transversal seal is left unfolded. In this way the half-folded packaging container is still is easy to handle and dimensionally stable when put on a shelf in the food store or on a table or the like.

FIG. 5b shows an alternative, preferred example of a packaging container 50b produced from an alternative packaging laminate 20 according to the invention. The alternative packaging laminate is thinner by having a thinner paper bulk layer 21, and thus it is not dimensionally stable enough to form a cuboid, parallellepipedic or wedge-shaped packaging container, and is not fold formed after transversal sealing 52b. It will thus remain a pillow-shaped pouch-like container and be distributed and sold in this form. Also packaging materials of the type described in connection with FIG. 1b, are particularly suitable for such pouch packages for liquid food and beverage.

FIG. 5c shows a gable top package 50c, which is fold-formed from a pre-cut sheet or blank, from the laminated packaging material comprising a bulk layer of paperboard and the durable barrier film of the invention. Also flat top packages may be formed from similar blanks of material.

FIG. 5d shows a bottle-like package 50d, which is a combination of a sleeve 54 formed from a pre-cut blanks of the laminated packaging material of the invention, and a top in 55, which is formed by injection moulding plastics in combination with an opening device such as a screw cork or the like. This type of packages are for example marketed under the trade names of Tetra Top® and Tetra Evero®. Those particular packages are formed by attaching the moulded top 55 with an opening device attached in a closed position, to a tubular sleeve 54 of the laminated packaging material, sterilizing the thus formed bottle-top capsule, filling it with the food product and finally fold-forming the bottom of the package and sealing it.

FIG. 6 shows the principle as described in the introduction of the present application, i.e. a web of packaging material is formed into a tube 61 by the longitudinal edges 62 of the web being united to one another in an overlap joint 63. The tube is filled 64 with the intended liquid food product and is divided into individual packages by repeated transversal seals 65 of the tube at a pre-determined distance from one another below the level of the filled contents in the tube. The packages 66 are separated by incisions in the transversal seals and are given the desired geometric configuration by fold formation along prepared crease lines in the material.

We have thus seen that the laminated packaging material of the invention, enable the providing of packaging containers with good integrity properties also under wet conditions, i.e. for the packaging of liquid or wet food products with long shelf life.

The invention is not limited by the embodiments shown and described above, but may be varied within the scope of the claims.

The invention claimed is:

1. A laminated packaging material for packaging of liquid food products, the laminated packaging material comprising:
   a polymer substrate layer in the form of a web or sheet,
   a first coating of an amorphous diamond-like carbon (DLC) in contact with a first side of the polymer substrate layer, wherein the first coating of the amorphous DLC is 2 to 50 nm thick,
   a bulk layer of paper or paperboard or other cellulose-based material,
   a bonding layer that binds together a surface of the first DLC coating of the polymer substrate layer and a surface of a first side of the bulk layer,
   a first, outermost liquid tight, heat sealable polymer layer bound to a second side of the bulk layer of paper or paperboard or other cellulose-based material, wherein the first outermost polymer layer provides the outermost surface of a packaging container made from the laminate packaging material,
   a second coating of an amorphous DLC in an adhesion-promoting primer coating that coats a second side of the polymer substrate layer, wherein the second coating of amorphous DLC is 2 to 50 nm thick, and
   a second, innermost liquid tight, heat sealable polymer layer bonded to the second amorphous DLC coating on the side opposite from the polymer substrate layer, wherein the second, innermost polymer layer provides the innermost surface of a packaging container made from the packaging material to be in contact with a packed product.

2. The laminated packaging material of claim 1, wherein the bonding layer is a thermoplastic polymer bonding layer.

3. The laminated packaging material of claim 1, wherein the first and second DLC coatings are oxygen barriers.

4. The laminated packaging material of claim 1, wherein the substrate polymer layer comprises a polymer film comprising a polymer selected from the group consisting of a polyethylene terephthalate (PET), a polyester, a polyamide, and a blend of any of said polymers.

5. The laminated packaging material of claim 4, wherein the substrate layer comprises a multilayer film having a surface layer comprising at least one of said polymers.

6. The laminated packaging material of claim 1, wherein the first amorphous diamond-like coating is 2 to 11.9 nm thick.

7. The laminated packaging material of claim 1, wherein the second amorphous diamond-like carbon coating, acting as an adhesion-promoting primer coating, is 2 to 11.9 nm thick.

8. The laminated packaging material of claim 1, wherein the substrate layer is an oriented PET film.

9. The laminated packaging material of claim 1, wherein the substrate layer is 8 to 12 μm thick.

10. The packaging container comprising the laminated packaging material as defined in claim 1.

11. The laminated packaging material according to claim 1, wherein said substrate consists of BOPET.

12. A laminated packaging material for packaging of liquid food products, the laminated packaging material comprising:
   a polymer film substrate layer in the form of a web or sheet,
   a first coating of an amorphous diamond-like carbon (DLC) in contact with a first side of the polymer film substrate layer,
   a bulk layer of paper or paperboard or other cellulose-based material on a side of the amorphous DLC opposite from the polymer film,
   a bonding layer between the polymer film substrate and a first side of the bulk layer of paper or paperboard or other cellulose-based material,
   a first outermost liquid tight, heat sealable polymer layer on an exterior side of the bulk layer of paper or paperboard or other cellulose-based material, wherein the first outermost polymer layer provides the outermost surface of a packaging container made from the laminate packaging material,
   a second coating of an amorphous diamond-like carbon (DLC) in an adhesion promoting primer coating that coats a second side of the polymer film substrate layer, and
   a second, innermost liquid tight, heat sealable polymer layer in contact with the second coating of the amorphous DLC in the adhesion promoting primer, wherein the second coating of the amorphous DLC in the adhesion promoting primer is between the polymer film substrate and the second, innermost liquid tight, heat sealable polymer layer, wherein the second, innermost polymer layer provides the innermost surface of a packaging container made from the packaging material to be in contact with a packed product.

13. The laminated packaging material according to claim 1, wherein said innermost liquid tight, heat sealable polymer layer is a polyolefin layer.

14. The laminated packaging material according to claim 13, wherein said polyolefin is polyethylene.

15. The laminated packaging material according to claim 1, wherein the innermost liquid tight, heat sealable polymer layer is melt extrusion coated onto the second coating of the amorphous DLC in the adhesion-promoting primer coating.

16. The laminated packaging material according to claim 1, wherein said bonding layer is a polyolefin layer.

17. The laminated packaging material according to claim 16, wherein said polyolefin is polyethylene.

18. The laminated packaging material according to claim 1, wherein said bonding layer is melt extrusion laminated onto the first coating of the amorphous DLC.

* * * * *